(12) United States Patent
Wu et al.

(10) Patent No.: US 12,484,405 B2
(45) Date of Patent: Nov. 25, 2025

(54) PROFILED DISPLAY PANEL AND DISPLAY DEVICE

(71) Applicants: HEFEI BOE JOINT TECHNOLOGY CO., LTD., Anhui (CN); BOE TECHNOLOGY GROUP CO., LTD, Beijing (CN)

(72) Inventors: Liu Wu, Beijing (CN); Zhidong Yuan, Beijing (CN); Yongqian Li, Beijing (CN); Can Yuan, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/249,359

(22) PCT Filed: Mar. 7, 2022

(86) PCT No.: PCT/CN2022/079541
§ 371 (c)(1),
(2) Date: Apr. 17, 2023

(87) PCT Pub. No.: WO2023/168559
PCT Pub. Date: Sep. 14, 2023

(65) Prior Publication Data
US 2024/0373687 A1    Nov. 7, 2024

(51) Int. Cl.
*H10K 59/131* (2023.01)
*H10K 59/10* (2023.01)
*H10K 59/121* (2023.01)

(52) U.S. Cl.
CPC ....... *H10K 59/131* (2023.02); *H10K 59/1213* (2023.02); *H10K 59/221* (2023.02)

(58) Field of Classification Search
CPC ... G09G 3/3266; G09G 3/3674; H10K 59/221
See application file for complete search history.

(56) References Cited

U.S. PATENT DOCUMENTS 8,698,391 B2 * 4/2014 Cok ...................... H10K 59/129
                                                            345/82
11,156,882 B2 * 10/2021 Qin ...................... G09G 3/3674
(Continued)

FOREIGN PATENT DOCUMENTS

| CN | 104700813 A | 6/2015 |
| CN | 105575318 A | 5/2016 |

(Continued)

*Primary Examiner* — Kevin M Nguyen
(74) *Attorney, Agent, or Firm* — BROOKS KUSHMAN P.C.

(57) ABSTRACT

A profiled display panel, including a display area. The display area includes a plurality of display sub-areas; a plurality of cascade signal lines for coupling adjacent two of the gate driving sub-circuits. At least one cascade signal line includes a first cascade trace extending in a first direction and a second cascade trace extending in a second direction. The first cascade trace includes a plurality of first conductive patterns arranged on a first conductive layer and second conductive pattern arranged on a second conductive layer. The plurality of first conductive patterns are electrically connected to the second conductive pattern; and the second cascade trace includes a third conductive pattern arranged on the first conductive layer.

20 Claims, 9 Drawing Sheets

(56) References Cited

U.S. PATENT DOCUMENTS

| | | |
|---|---|---|
| 2016/0035747 A1 | 2/2016 | Zhang et al. |
| 2016/0293270 A1 | 10/2016 | Jin |
| 2019/0228695 A1 | 7/2019 | Xou |
| 2019/0266933 A1 | 8/2019 | Lee et al. |
| 2020/0035185 A1 | 1/2020 | Nishiyama et al. |
| 2021/0263355 A1 | 8/2021 | Park |
| 2022/0114933 A1 | 4/2022 | Zhu et al. |
| 2022/0180816 A1 | 6/2022 | Yuan et al. |
| 2022/0199735 A1 | 6/2022 | Wang et al. |
| 2023/0043145 A1 | 2/2023 | Yuan et al. |
| 2023/0169908 A1 | 6/2023 | Xu et al. |

FOREIGN PATENT DOCUMENTS

| | | |
|---|---|---|
| CN | 106023944 A | 10/2016 |
| CN | 106782416 A | 5/2017 |
| CN | 106952607 A | 7/2017 |
| CN | 108320693 A | 7/2018 |
| CN | 110782853 A | 2/2020 |
| CN | 111261094 A | 6/2020 |
| CN | 111613145 A | 9/2020 |
| CN | 111816123 A | 10/2020 |
| CN | 112310125 A | 2/2021 |
| CN | 113362770 A | 9/2021 |
| CN | 113571021 A | 10/2021 |
| CN | 113593462 A | 11/2021 |
| CN | 214955729 U | 11/2021 |
| CN | 114120905 A | 3/2022 |
| WO | 2021253344 A1 | 12/2021 |

\* cited by examiner

PROFILED DISPLAY PANEL AND DISPLAY DEVICE

CROSS-REFERENCE TO RELATED APPLICATIONS

This application is the U.S. national phase of PCT Application No. PCT/CN2022/079541 filed on Mar. 7, 2022, which is incorporated herein by reference in its entirety.

TECHNICAL FIELD

The present disclosure relates to the field of display technology, particularly to a profiled display panel and a display device.

BACKGROUND

With the rapid development of the global display industry, the market demand is becoming more and more diversified. The traditional display screen has a single shape and limited functions, and it cannot be changed optionally according to the scene. It has begun to fail to meet the needs of the high-ranking display, so a profiled screen comes into being.

Because of the different shapes of profiled screens, it is necessary to adopt a grouped GIA (Gate Drive In Active Area) technology. The cascade signal lines between different GIA groups are made of a gate metal layer (GT layer), but the GT layer is made of Mo metal, and the resistance is too high. The cascade signal lines between different GIA groups have too high resistance, which leads to cascading abnormality. The signal bus is also made of a single-layer GT, and has the same problems.

SUMMARY

A first aspect of the present disclosure provides a profiled display panel, including a display area including a plurality of display sub-areas.

The profiled display panel includes a base substrate and a gate driving circuit located on the base substrate. The gate driving circuit includes:

a plurality of mutually cascaded gate driving sub-circuits, where the plurality of mutually cascaded gate driving sub-circuits correspond, in one-to-one manner, to the plurality of display sub-areas, and each of the gate driving sub-circuits is located in a corresponding one of the display sub-areas; and a plurality of cascade signal lines used to couple adjacent two of the gate driving sub-circuits, where at least one of the cascade signal lines includes a first cascade trace extending in a first direction and a second cascade trace extending in a second direction, where the first cascade trace includes a plurality of first conductive patterns arranged on a first conductive layer, and a second conductive pattern arranged on a second conductive layer, the plurality of first conductive patterns are electrically connected to the second conductive pattern, and an orthographic projection of the plurality of first conductive patterns onto the base substrate at least partially overlaps an orthographic projection of the second conductive pattern onto the base substrate; the second cascade trace includes a third conductive pattern arranged on the first conductive layer.

Optionally, the plurality of first conductive patterns are electrically connected to the second conductive pattern through a plurality of via holes.

Optionally, the plurality of first conductive patterns are arranged at intervals.

Optionally, the profiled display panel includes a first gate metal layer, a second gate metal layer, and a first source-drain metal layer that are sequentially stacked in a direction away from the base substrate, the first conductive layer is formed by using the first source-drain metal layer, and the second conductive layer is formed by using the first gate metal layer.

Optionally, the first cascade trace further include: a fourth conductive pattern, electrically connected to the plurality of first conductive patterns, where the orthographic projection of the plurality of first conductive patterns onto the base substrate at least partially overlaps an orthographic projection of the fourth conductive pattern onto the base substrate. The fourth conductive pattern is electrically connected to the second conductive pattern, and the orthographic projection of the second conductive pattern onto the base substrate at least partially overlaps the orthographic projection of the fourth conductive pattern onto the base substrate.

Optionally, the second cascade trace further includes: a fifth conductive pattern, electrically connected to the third conductive pattern, an orthographic projection of the fifth conductive pattern onto the base substrate at least partially overlaps an orthographic projection of the third conductive pattern onto the base substrate.

Optionally, the profiled display panel further includes: a plurality of rows of sub-pixel driving circuits located on the base substrate, and the sub-pixel driving circuits further include:

a plurality of first initialization signal lines, where at least a portion of the first initialization signal line extends in the second direction;

a plurality of second initialization signal lines, where at least a portion of the second initialization signal line extends in the second direction;

a plurality of data lines, where at least a portion of the data line extending in the second direction; and a plurality of power lines, where at least a portion of the power line extending in the second direction, where orthographic projection of the first conductive patterns onto the base substrate does not overlap an orthographic projection of the data lines onto the base substrate, an orthographic projection of the power lines onto the base substrate, an orthographic projection of the first initialization signal lines onto the base substrate, and an orthographic projection of the second initialization signal lines onto the base substrate.

Optionally, the first initialization signal lines, the second initialization signal lines, the data lines and the power lines are arranged in a same layer and made of a same material as the first conductive patterns.

Optionally, the sub-pixel driving circuit further includes: a data writing transistor, a first reset transistor, a driving transistor, a second reset transistor, and a light-emitting control transistor;

the sub-pixel driving circuits further include: first scanning lines, second scanning lines, third scanning lines, and light-emitting control signal lines;

where a first electrode of the data writing transistor is coupled to a corresponding one of the data lines, a second electrode of the data writing transistor is coupled to a second electrode of the first reset transistor, and a gate electrode of the data writing transistor is coupled to a corresponding one of the first scanning lines;

a first electrode of the first reset transistor is coupled to a corresponding one of the second initialization signal lines, and a second electrode of the first reset transistor is coupled to the second electrode of the data writing transistor, and a gate electrode of the first reset transistor is coupled to a corresponding one of the second scanning lines;

a first electrode of the driving transistor is coupled to a second electrode of the second reset transistor, a second electrode of the driving transistor is coupled to a second electrode of the light-emitting control transistor, and a gate electrode of the driving transistor is coupled to the second electrode of the data writing transistor;

a first electrode of the second reset transistor is coupled to a corresponding one of the first initialization signal lines, a second electrode of the second reset transistor is coupled to an anode of the light-emitting element, and a gate electrode of the second reset transistor is coupled to a corresponding one of the third scanning lines;

a first electrode of the light-emitting control transistor is coupled to a corresponding one of the power lines, a second electrode of the light-emitting control transistor is coupled to the second electrode of the driving transistor, and a gate electrode of the light-emitting control transistor is coupled to the light-emitting control signal line;

a first plate of a storage capacitor is reused as the gate electrode of the driving transistor, and a second plate of the storage capacitor is coupled to the second electrode of the second reset transistor.

Optionally, at least one of the gate driving sub-circuits includes: a plurality of mutually cascaded first GOA units, a plurality of mutually cascaded second GOA units, a plurality of mutually cascaded third GOA units, and a plurality of mutually cascaded fourth GOA units;

where the first GOA unit at least includes: a first cascade output terminal, a reset signal terminal, and a first signal input terminal;

the second GOA unit includes a second signal input terminal and a second cascade output terminal;

the third GOA unit includes a third signal input terminal and a third cascade output terminal; and the fourth GOA unit includes a fourth signal input terminal and a fourth cascade output terminal;

the plurality of cascade signal lines include: a first cascade output signal line, a reset signal line, a second signal input line, a third signal input line, and a fourth signal input line;

where one end of the first cascade output signal line is coupled to a first cascade output terminal of a last one of the first GOA units of one gate driving sub-circuit in adjacent two of the gate driving sub-circuits, and the other end of the first cascade output signal line is coupled to a first signal input terminal of a first one of the first GOA units of the other gate driving sub-circuit in adjacent two of the gate driving sub-circuits;

one end of the reset signal line is coupled to a reset signal terminal of the last one of the first GOA units of one gate driving sub-circuit in adjacent two of the driving sub-circuits, and the other end of the reset signal line is coupled to the first signal input terminal of the first one of the first GOA units of the other gate driving sub-circuit in adjacent two of the gate driving sub-circuits;

one end of the second signal input line is coupled to a second cascade output terminal of a last one of the second GOA units of one gate driving sub-circuit in adjacent two of the gate driving sub-circuits, and the other end of the second signal input line is coupled to a second signal input terminal of a first one of the second GOA units of the other gate driving sub-circuit in adjacent two of the gate driving sub-circuits;

one end of the third signal input line is coupled to a third cascade output terminal of a last one of the third GOA units of one gate driving sub-circuit in adjacent two of the gate driving sub-circuits, and the other end of the third signal input line is coupled to a third signal input terminal of a first one of the third GOA units of the other gate driving sub-circuit in adjacent two of the gate driving sub-circuits;

one end of the fourth signal input line is coupled to a fourth cascade output terminal of a last one of the fourth GOA units of one gate driving sub-circuit in adjacent two of the gate driving sub-circuits, and the other end of the fourth signal input line is coupled to a fourth signal input terminal of a first one of the fourth GOA units of the other gate driving sub-circuit in adjacent two of the gate driving sub-circuits.

Optionally, a first gap is provided between two adjacent columns of sub-pixel driving circuits;

a second gap is provided between two adjacent rows of sub-pixel driving circuits;

the second signal input line includes two parallel second signal input sub-lines, where at least a portion of one second signal input sub-line extends in the second direction, at least a portion of the other second signal input sub-line extends in the second direction, and the two parallel second signal input sub-lines are located in a same second gap;

the third signal input line includes two parallel third signal input sub-lines, where at least a portion of one third signal input sub-line extends in the second direction, at least a portion of the other third signal input sub-line extends in the second direction, and the two parallel third signal input sub-lines are located in different first gaps; and the fourth signal input line includes two parallel fourth signal input sub-lines, where at least a portion of one fourth signal input sub-line extends in the second direction, at least a portion of the other third signal input sub-line extends in the second direction, and the two parallel third signal input sub-lines are located in different first gaps.

Optionally, the first GOA unit is coupled to the first scanning lines; the second GOA unit is coupled to the second scanning lines; the third GOA unit is coupled to the third scanning lines; and the fourth GOA unit is coupled to the light-emitting control signal lines.

Optionally, orthographic projections of the first GOA unit, the second GOA unit, the third GOA unit, and the fourth GOA unit onto the base substrate are located between orthographic projections of two adjacent rows of sub-pixel driving circuits onto the base substrate.

Optionally, the first GOA unit, the second GOA unit, the third GOA unit, and the fourth GOA unit include: a general reset terminal, a first clock signal terminal, a second clock signal terminal, and a high-level terminal;

the profiled display panel further includes: a plurality of buses and a plurality of common signal line groups located on the base substrate;

the plurality of buses at least include: a plurality of reset buses, a plurality of first clock buses, a plurality of second clock buses, and a plurality of high-level buses;

at least one of the common signal line groups includes:
a plurality of general reset signal lines located on the base substrate, where one end of at least one of the general reset signal lines is coupled to a corresponding one of the reset buses, and the other end is coupled to the general reset terminal of the first GOA unit, the second GOA unit, the third GOA unit, or the fourth GOA unit;
a plurality of first clock signal lines located on the base substrate, where one end of at least one of the first clock signal lines is coupled to a corresponding one of the first clock buses, and the other end is coupled to the first clock signal terminal of the first GOA unit, the second GOA unit, the third GOA unit, or the fourth GOA unit;
a plurality of second clock signal lines located on the base substrate, one end of at least one of the second clock signal lines is coupled to a corresponding one of the second clock buses, and the other end is coupled to the second clock signal terminal of the first GOA unit, the second GOA unit, the third GOA unit, or the fourth GOA unit; and
a plurality of high-level signal lines located on the base substrate, one end of at least one of the high-level signal lines is coupled to a corresponding one of the high-level buses, and the other end is coupled to the high-level terminal of the first GOA unit, the second GOA unit, the third GOA unit, or the fourth GOA unit.

Optionally, a length of a cascade signal line between two of the gate driving sub-circuits is greater than a length of a cascade signal line between two of the first GOA units included in the gate driving sub-circuits;

the length of the cascade signal line between two of the gate driving sub-circuits is greater than a length of a cascade signal line between two of the second GOA units included in the gate driving sub-circuits;

the length of the cascade signal lines between the two gate driving sub-circuits is greater than a length of a cascade signal line between two of the third GOA units included in the gate driving sub-circuits; and the length of the cascade signal lines between the two gate driving sub-circuits is greater than a length of a cascade signal line between two of the fourth GOA units included in the gate driving sub-circuits.

Optionally, the orthographic projection of the first conductive patterns onto the base substrate does not overlap an orthographic projection of the first clock signal line onto the base substrate and an orthographic projection of the second clock signal line onto the base substrate.

Optionally, the first clock signal line and the second clock signal line are fabricated by using the first source-drain metal layer.

Optionally, at least one of the buses includes a third conductive layer and a fourth conductive layer, the third conductive layer is fabricated by using the first source-drain metal layer, and the fourth conductive layer is fabricated by using the first gate metal layer.

Optionally, the plurality of mutually cascaded gate driving sub-circuits include: a first gate driving sub-circuit, a second gate driving sub-circuit, a third gate driving sub-circuit, and a fourth gate driving sub-circuit;

where the first common signal line group is coupled to the first gate driving sub-circuit and the second gate driving sub-circuit;

the second common signal line group is coupled to the third gate driving sub-circuit; and the third common signal line group is coupled to the fourth gate driving sub-circuit.

A second aspect of the present disclosure provides a display device, including the above-mentioned profiled display panel.

REFERENCE REFERENCES

Figure 1:
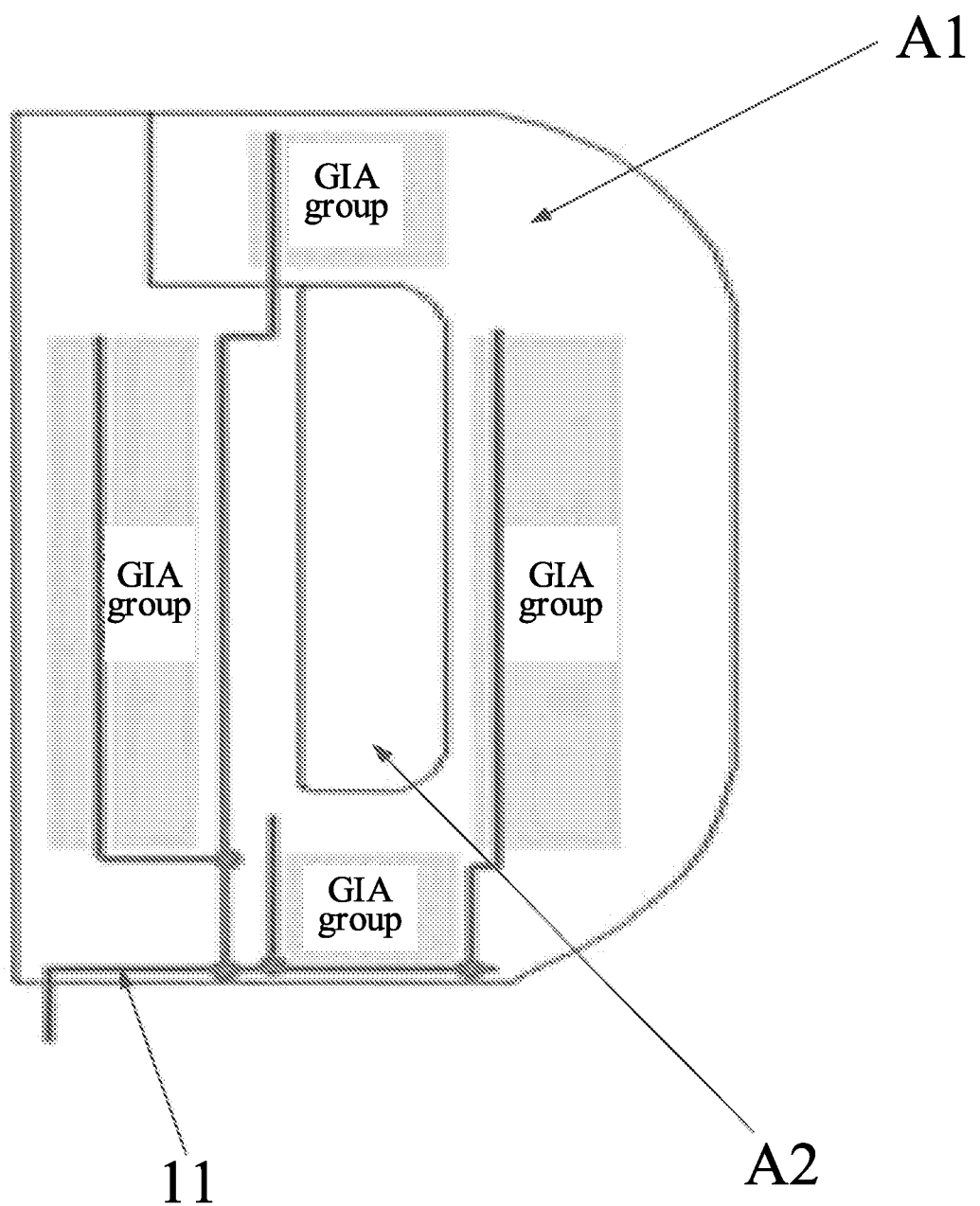
FIG. 1 is a schematic diagram of GIA groups of a profiled display panel provided by an embodiment of the present disclosure.

A1: Display area; A2: Non-display area; A3: Cascade signal line connection area;
A4: Connection area of first common signal line group and bus;
L1: First common signal line group, L2: Second common signal line group, L3: Third common signal line group;
U1: First GOA unit, U2: Second GOA unit, U3: Third GOA unit;
U4: Fourth GOA unit;
11: Bus;
21: First cascade output signal line, 22: Reset signal line, 23: Second signal input line;
24: Third signal input line, 25: Fourth signal input line;
231: Second signal input sub-line, 241: Third signal input sub-line, 251: Fourth signal input sub-line;

31: First scanning line, 32: Second scanning line, 33: Third scanning line, 34: Light-emitting control signal line;

35: First initialization signal line, 36: Second initialization signal line, 37: Data line, 38: Power line;

41: First clock signal line, 42: Second clock signal line;

51: First conductive pattern, 52: Orthographic projection of a first conductive pattern onto a first gate metal layer;

61: First gate insulating layer, 62: First gate metal layer, 63: Second gate insulating layer, 64: Interlayer dielectric layer, 65: First source-drain metal layer;

71: Via hole.

DETAILED DESCRIPTION

In order to make the to-be-solved technical problems, technical solutions and advantages of embodiments of the present disclosure clearer, a detailed description is given below with the appended drawings and specific embodiments.

The embodiments of the present disclosure provide a profiled display panel and a display device to solve the problem of abnormal cascading caused by that the resistance of cascaded signal lines between different GIA groups is too large in the related art.

An embodiment of the present disclosure provides a profiled display panel, including a display area. The display area includes a plurality of display sub-areas. The profiled display panel includes a base substrate and a gate driving circuit located on the base substrate. The gate driving circuit includes:

a plurality of mutually cascaded gate driving sub-circuits; where the plurality of mutually cascaded gate driving sub-circuits correspond, in one-to-one manner, to the plurality of display sub-areas, and each of the gate driving sub-circuits is located in a corresponding one of the display sub-areas; and a plurality of cascade signal lines, used to couple adjacent two of the gate driving sub-circuits, where at least one of the cascade signal lines includes a first cascade trace extending in a first direction and a second cascade trace extending in a second direction.

The first cascade trace includes a plurality of first conductive patterns arranged on a first conductive layer and a second conductive pattern arranged on a second conductive layer, the plurality of first conductive patterns are electrically connected to the second conductive pattern, and an orthographic projection of the plurality of first conductive patterns onto the base substrate at least partially overlaps an orthographic projection of the second conductive pattern onto the base substrate; the second cascade trace include a third conductive pattern arranged on the first conductive layer.

In the embodiments of the present disclosure, the first cascade trace includes a plurality of first conductive patterns arranged on the first conductive layer and a second conductive pattern arranged on the second conductive layer and electrically connected to the plurality of first conductive patterns, which can reduce a resistance on the first cascade trace, and avoid the abnormal cascade of cascade signal lines.

Optionally, the plurality of display sub-areas include: a first display sub-area, a second display sub-area, a third display sub-area, and a fourth display sub-area, where the first display sub-area is arranged opposite to the third display sub-area, the second display sub-area is arranged opposite to the fourth display sub-area, and the third display sub-area is close to a side of the profiled display panel where a plurality of buses are located.

The plurality of mutually cascaded gate driving sub-circuits include: a first gate driving sub-circuit, a second gate driving sub-circuit, a third gate driving sub-circuit and a fourth gate driving sub-circuit.

The first gate driving sub-circuit is located in the first display sub-area, the second gate driving sub-circuit is located in the second display sub-area, the third gate driving sub-circuit is located in the third display sub-area, and the fourth gate driving sub-circuit is located in the fourth display sub-area.

The embodiments of the present disclosure can realize a grouping design of the gate driving circuits by arranging the gate driving sub-circuits in different display sub-areas.

Referring to FIG. 1, a D-shaped non-display area A2 is in the middle of a profiled display panel, and a display area A1 is around the non-display area A2. Four gate driving sub-circuits are arranged in the four display sub-areas of the display area A1, and since the gate driving circuit is arranged in the display area, it is called a GIA group (Gate Drive In Active Area).

Figure 2:
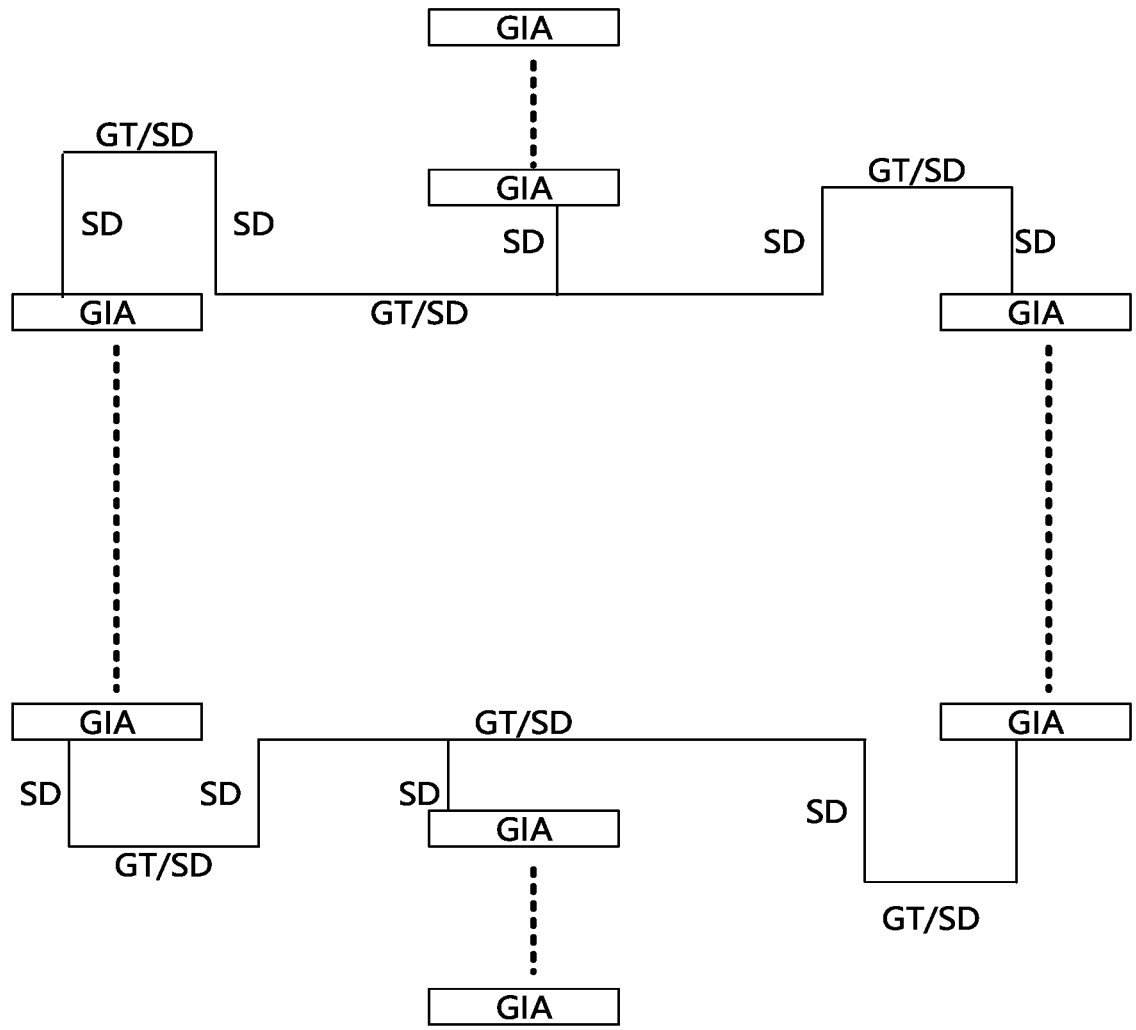
FIG. 2 is a schematic diagram of a trace manner of cascade signal lines between different GIA groups provided by an embodiment of the present disclosure.

Combined with FIG. 2, four GIA groups cascade with each other, and every two GIA groups in the four GIA groups are coupled through cascade signal lines.

The first direction described in the present disclosure is a transverse direction and the second direction is a longitudinal direction.

It should be noted that the profiled display panel provided by the embodiment of the present disclosure is not only suitable for D-shaped display panel, but also suitable for Y-shaped or I-shaped display panel.

At least one of the cascade signal lines has a plurality of transverse segments and a plurality of longitudinal segments.

Optionally, the plurality of first conductive patterns are arranged at intervals. The multiple first conductive patterns provided by the embodiments of the present disclosure are arranged at intervals, which can prevent the first conductive patterns from overlapping with other signal lines in the same layer.

The greater the number of the first conductive patterns, the lower the resistance on the first cascade traces.

Figure 17:
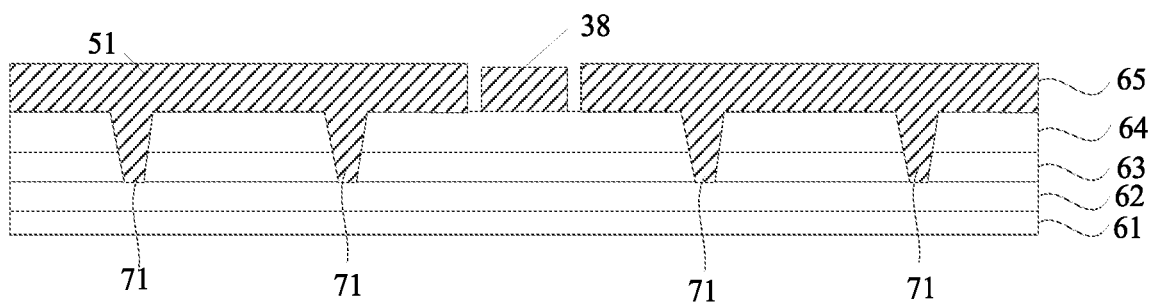
FIG. 17 is a cross-sectional diagram showing a position of first cascade traces in a manner of double-layer and having intervals provided by an embodiment of the present disclosure.

Optionally, the plurality of first conductive patterns are electrically connected to the second conductive patterns through a plurality of via holes. FIG. 17 is a cross-sectional diagram of a dual layer trace interval segment location for first cascade trace provided by an embodiment of the present disclosure. As shown in FIG. 17, in a direction away from the base substrate, the profiled display panel sequentially includes: a first gate insulating layer 61, a first gate metal layer 62, a second gate insulating layer 63, an interlayer dielectric layer 64, and a first source-drain metal layer 65. The first conductive patterns 51 are coupled to the first gate metal layer 65 through the via holes 71, and combined with FIG. 12, the first conductive patterns 51 keep away from the power line 38. Illustratively, the first conductive patterns 51 are also away from a first initialization signal line 35, a second initialization signal line 36, and a data line 37. It should be noted that the number of via holes corresponding to one conductive pattern is not limited.

Figure 12:
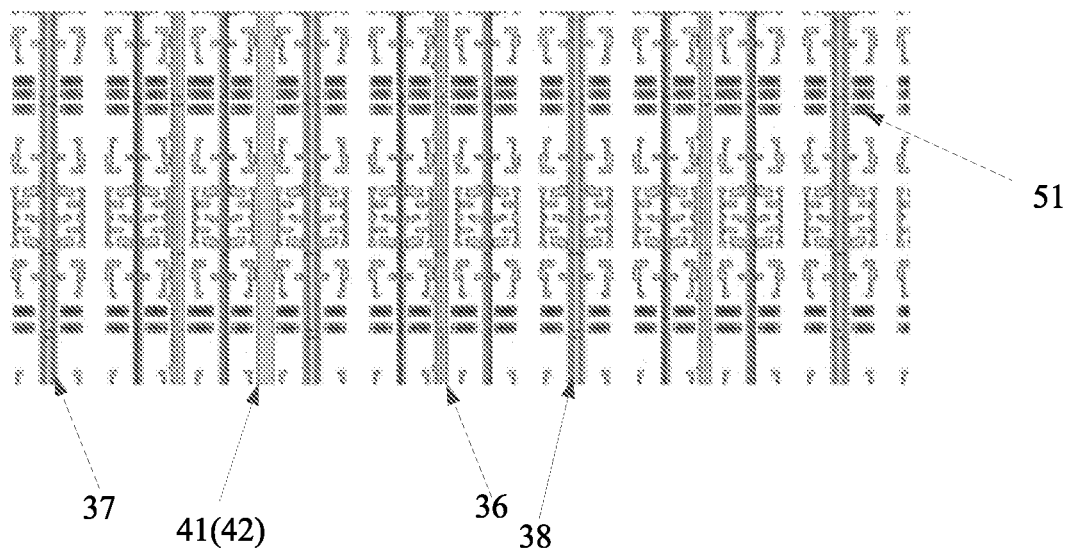
FIG. 12 is a schematic layout diagram of a first source-drain metal layer at a location corresponding to FIG. 10.

FIG. 12 shows a plurality of first conductive patterns 51 on the first source-drain metal layer of the first cascade trace. As seen from FIG. 12, the plurality of first conductive patterns 51 are arranged at intervals, to keep off longitudinal signal lines on the first source-drain metal layer.

Optionally, the profiled display panel includes a first gate metal layer, a second gate metal layer, and a first source-drain metal layer, which are sequentially stacked in a direction away from the base substrate, the first conductive layer is made of the first source-drain metal layer, and the second conductive layer is made of the first gate metal layer.

In the embodiments of the present disclosure, the first conductive layer is made of the first source-drain metal layer, and the second conductive layer is made of the first gate metal layer, which can reduce the resistance on the second cascade trace since the source-drain metal layer has a lower sheet resistance than the gate metal layer.

As an example, the first source-drain metal layer is made of Ti/AL/Ti material with a sheet resistance of $0.05\Omega/\square$, and the first gate metal layer is made of Mo material with a sheet resistance of $0.5\Omega/\square$.

Referring to FIG. 2, the longitudinal segment is made of the first source-drain metal layer, while in the related art, the longitudinal segment is made of the first gate metal layer. Since the sheet resistance of the first source-drain metal layer is lower than that of the first gate metal layer, the resistance on the longitudinal segment is reduced, which can prevent serious GIA signal attenuation.

The transverse segment includes both a first source-drain metal layer and a first gate metal layer, and the manner of double-layer traces can reduce the overall resistance of the traces.

Figure 10:
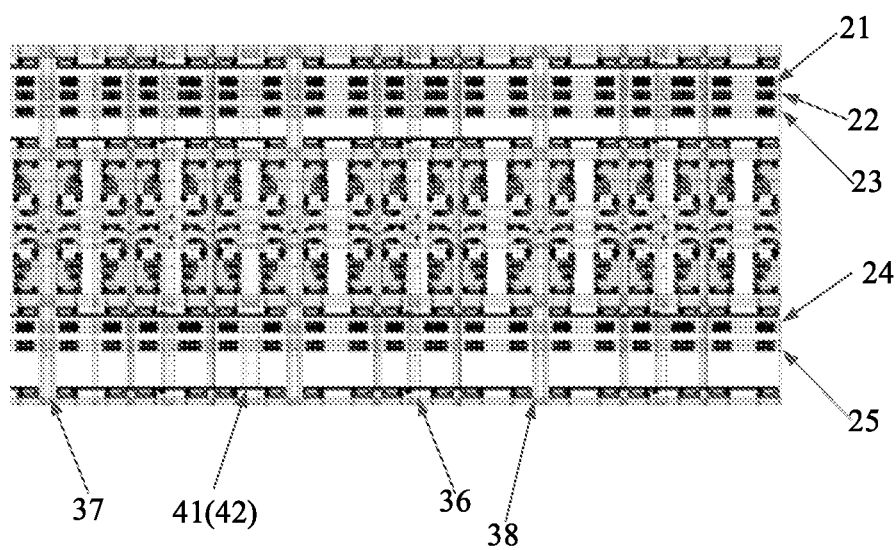
FIG. 10 is a schematic diagram showing the connection of cascade signal lines at position ⑥ in FIG. 4.
Figure 11:
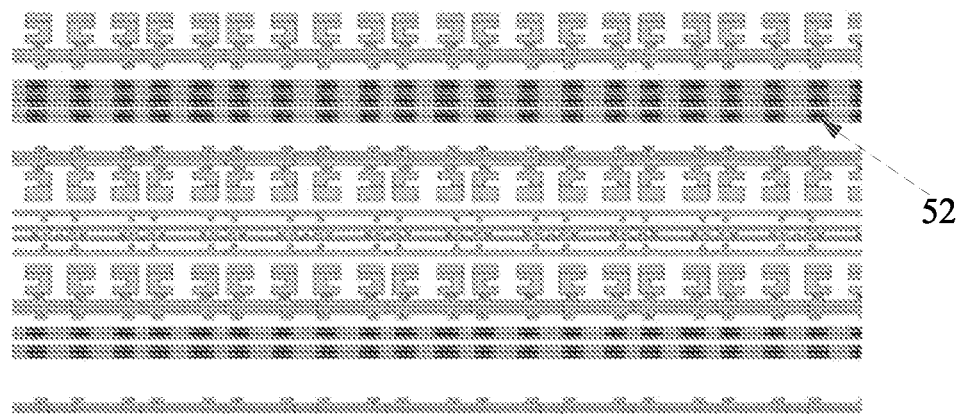
FIG. 11 is a schematic layout diagram of a first gate metal layer at a location corresponding to FIG. 10.

Meanwhile, referring to FIG. 11, FIG. 11 is a schematic layout diagram of a first gate metal layer at a location corresponding to FIG. 10. The first gate metal layer includes an orthographic projection 52 of the first conductive patterns 51 onto the first gate metal layer.

Optionally, at least one of the gate driving sub-circuits includes: a plurality of mutually cascaded first GOA units, a plurality of mutually cascaded second GOA units, a plurality of mutually cascaded third GOA units, and a plurality of mutually cascaded fourth GOA units.

The first GOA unit at least includes: a first cascade output terminal, a reset signal terminal, and a first signal input terminal.

The second GOA unit includes a second signal input terminal and a second cascade output terminal.

The third GOA unit includes a third signal input terminal and a third cascade output terminal.

The fourth GOA unit includes a fourth signal input terminal and a fourth cascade output terminal.

The plurality of cascade signal lines include: a first cascade output signal line, a reset signal line, a second signal input line, a third signal input line, and a fourth signal input line.

One end of the first cascade output signal line is coupled to a first cascade output terminal of the last one of the first GOA units of one gate driving sub-circuit in adjacent two gate driving sub-circuits, and the other end of the first cascade output signal line is coupled to a first signal input terminal of the first one of the first GOA unit of the other gate driving sub-circuit in the adjacent two gate driving sub-circuits.

One end of the reset signal line is coupled to a reset signal terminal of the last one of the first GOA units of one gate driving sub-circuit in adjacent two driving sub-circuit, and the other end of the reset signal line is coupled to a first signal input terminal of the first one of the first GOA units of the other gate driving sub-circuit in the adjacent two gate driving sub-circuits.

One end of the second signal input line is coupled to a second cascade output terminal of the last one of the second GOA units of one gate driving sub-circuit in adjacent two gate driving sub-circuits, and the other end of the second signal input line is coupled to a second signal input terminal of the first one of the second GOA units of the other gate driving sub-circuit in the adjacent two gate driving sub-circuits.

One end of the third signal input line is coupled to a third cascade output terminal of the last one of the third GOA units of one gate driving sub-circuit in adjacent two gate driving sub-circuits, and the other end of the third signal input line is coupled to a third signal input terminal of the first one of the third GOA units of the other gate driving sub-circuit in adjacent two gate driving sub-circuits.

One end of the fourth signal input line is coupled to a fourth cascade output terminal of the last one of the fourth GOA unit of one gate driving sub-circuit in adjacent two of the gate driving sub-circuits, and the other end of the fourth signal input line is coupled to a fourth signal input terminal of the first one of the fourth GOA unit of the other gate driving sub-circuit in adjacent two of the gate driving sub-circuits.

A profiled display panel provided by an embodiment of the present disclosure includes a plurality of cascade signal lines, which includes: a first cascade output signal line, a reset signal line, a second signal input line, a third signal input line, and a fourth signal input line. There are five cascade signal lines in total, which can realize the coupling between adjacent two of the gate driving sub-circuits.

Figure 3:
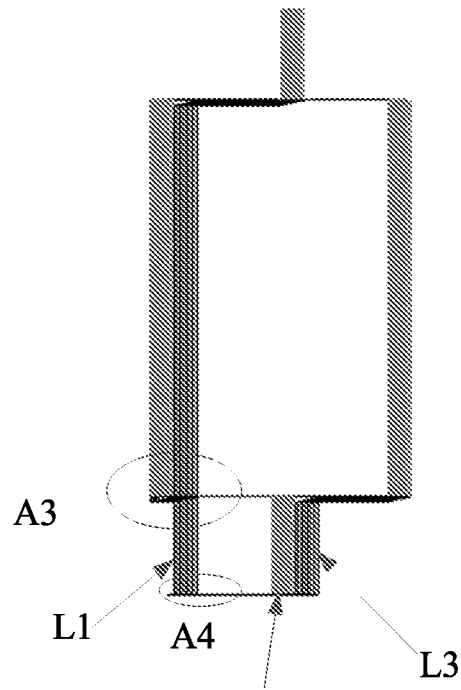
FIG. 3 is a schematic diagram of a common signal line group of the profiled display panel provided by an embodiment of the present disclosure.

Referring to FIG. 3 to FIG. 8, FIG. 14 and FIG. 15, FIG. 4 is an enlarged schematic diagram of a cascade signal line connection area A3 in FIG. 3. The gate driving sub-circuit on the left side of the display panel includes a first GOA unit U1, a third GOA unit U3, a second GOA unit U2 and a fourth GOA unit U4 in a first direction from being far away from the non-display area to being close to the non-display area.

The first GOA unit U1, the third GOA unit U3, the second GOA unit U2, and the fourth GOA unit U4 are driven independently of each other.

At least one of the gate driving sub-circuits further includes a plurality of first GOA units U1 distributed in the second direction, a plurality of third GOA units U3 distributed in the second direction, a plurality of second GOA units U2 distributed in the second direction, and a plurality of fourth GOA units U4 distributed in the second direction.

At least one of the gate driving sub-circuits includes a plurality of first GOA units U1 that are cascaded with each other, at least one of the gate driving sub-circuits includes a plurality of third GOA units U3 that are cascaded with each other, and at least one of the gate driving sub-circuits includes a plurality of fourth GOA units U4 that are cascaded with each other.

Figure 14:
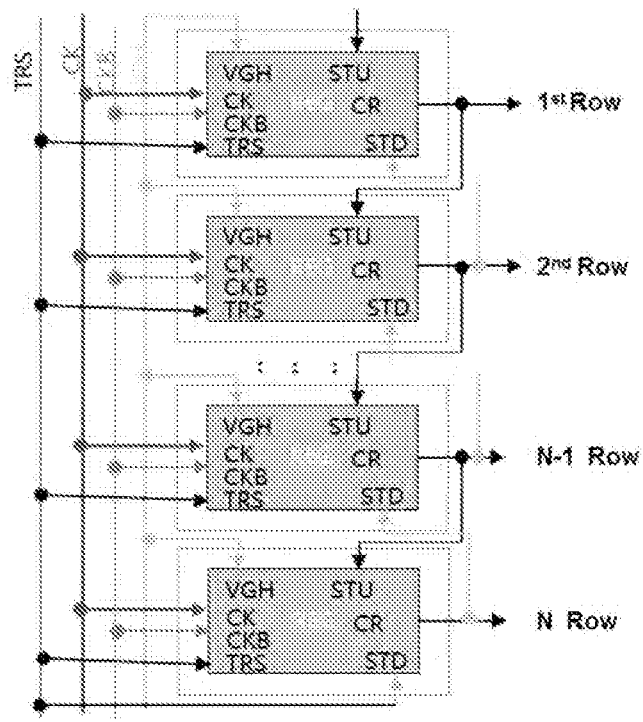
FIG. 14 is a schematic diagram showing an architecture of a first GOA unit U1.
Figure 15:
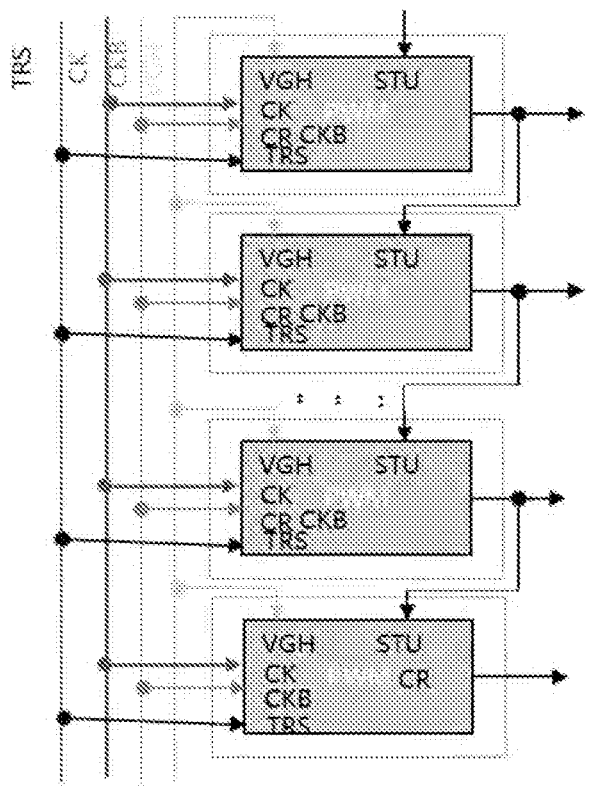
FIG. 15 is a schematic diagram showing an architecture of a second GOA unit U2, a third GOA unit U3, and a fourth GOA unit U4.

Referring to FIG. 14, FIG. 14 is a schematic diagram of the architecture of a first GOA unit U1, and FIG. 15 is a schematic diagram of the architecture of a second GOA unit U2, a third GOA unit U3 and a fourth GOA unit U4.

The architecture of the first GOA unit U1 is in a manner of a shift register cascade, the input signal of the first row is STU, the output CR of the first row acts as the input of the next row, and the output of the second row acts as the reset STD of the previous row.

The architectures of the second GOA unit U2, the third GOA unit U3, and the fourth GOA unit U4 are the same. Using PWM architecture, it is only necessary to cascade an output signal of a certain row to an input terminal of the next row.

There are five cascade signal lines between adjacent two of the gate driving sub-circuits, which are: a first cascade output signal line, a reset signal line, a second signal input line, a third signal input line, and a fourth signal input line.

Figure 4:
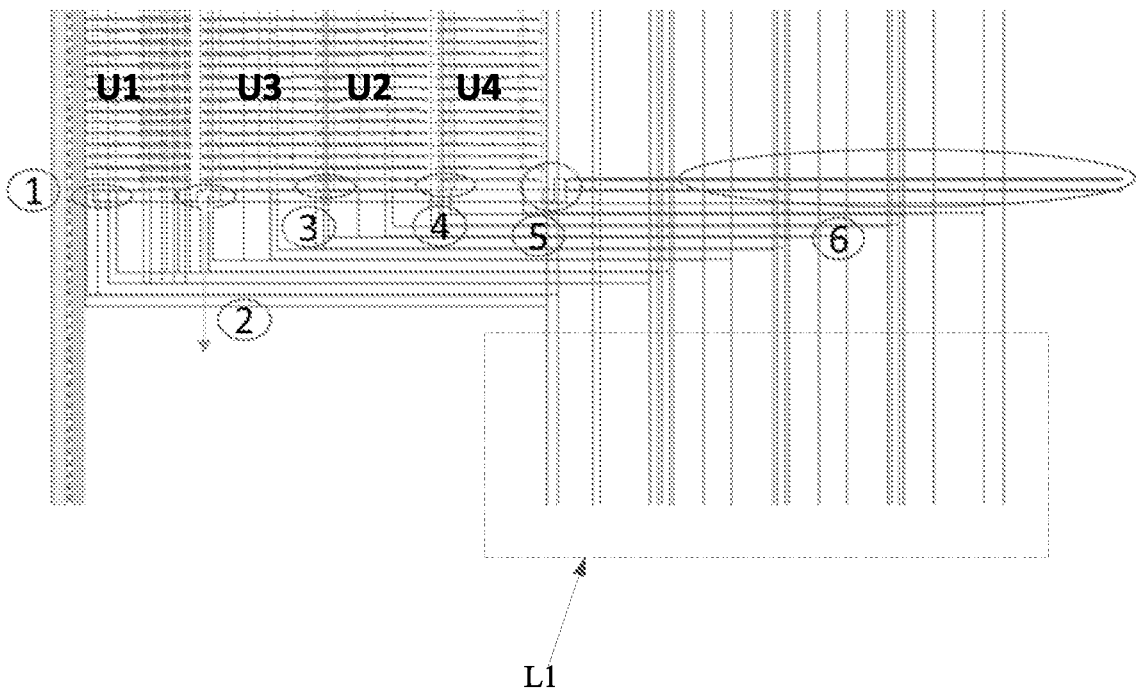
FIG. 4 is an enlarged schematic diagram of area A3 in FIG. 3.
Figure 5:
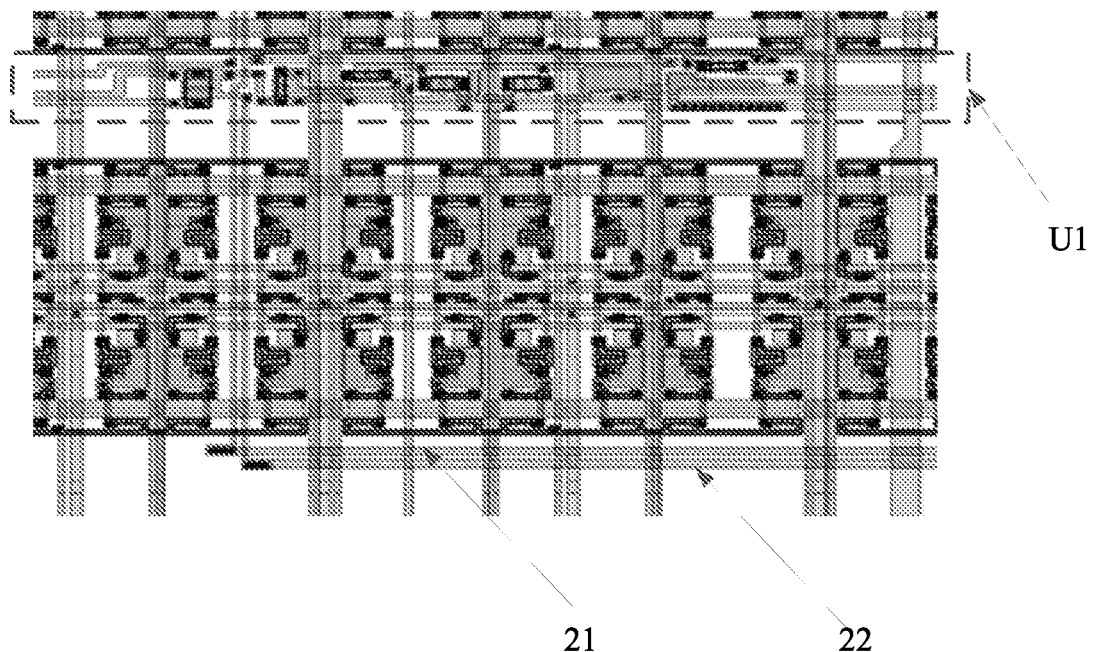
FIG. 5 is a schematic diagram showing the connection of cascade signal lines at position ① in FIG. 4.

Referring to FIG. 5, FIG. 5 is a schematic diagram showing the connection of cascade signal lines at position ① in FIG. 4. The first cascade output signal line 21 and reset signal lines 22 are used for connecting between the last one of the first GOA units of one gate driving sub-circuit in adjacent two of the gate driving sub-circuits and the first one of the first GOA units of the other gate driving sub-circuit in adjacent two of the gate driving sub-circuits.

Figure 7:
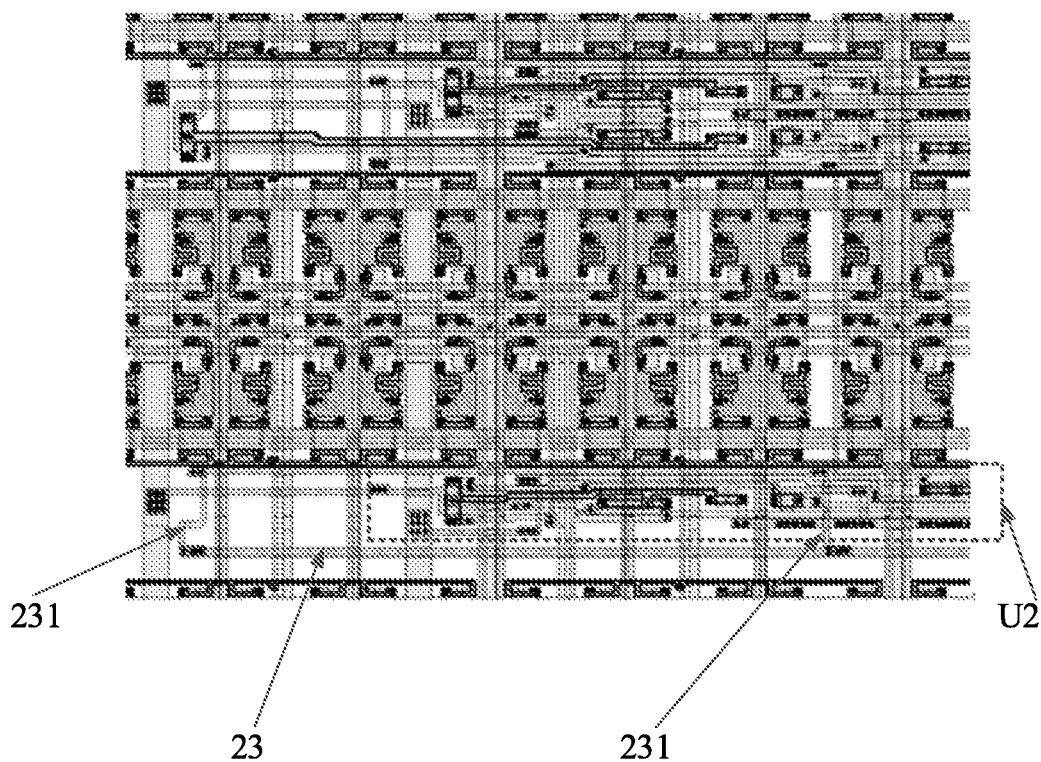
FIG. 7 is a schematic diagram showing the connection of cascade signal lines at position ③ in FIG. 4.

Referring to FIG. 7, FIG. 7 is a schematic diagram showing the connection of cascade signal lines at position ③ in FIG. 4. The second signal input line 23 is used for connecting between the last one of the second GOA units of one gate driving sub-circuit in adjacent two of the gate driving sub-circuits and the first one of the second GOA units of the other gate driving sub-circuit in adjacent two of the gate driving sub-circuits.

Figure 6:
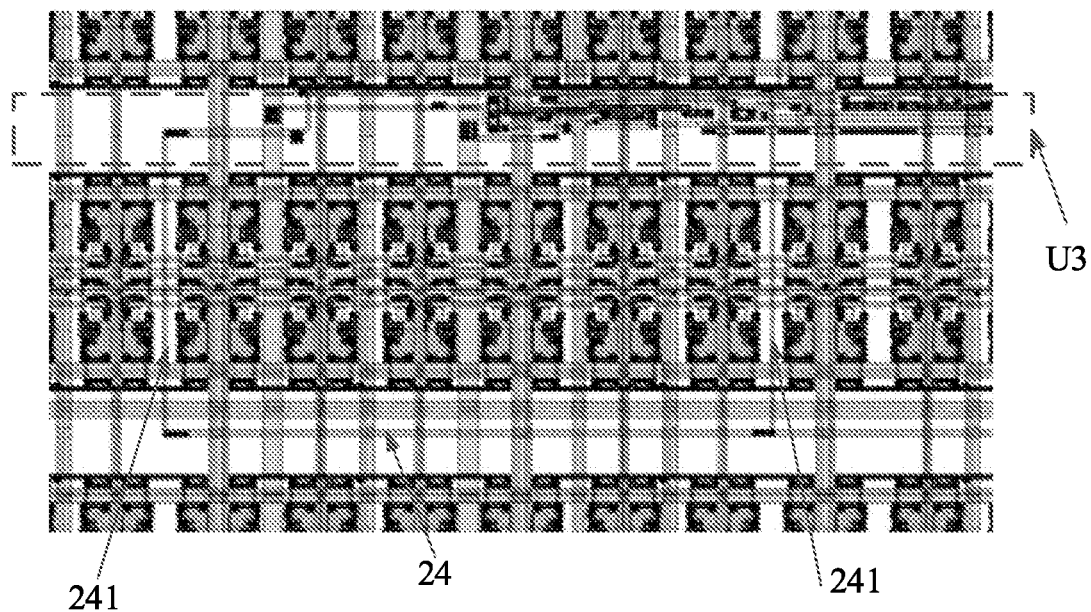
FIG. 6 is a schematic diagram showing the connection of cascade signal lines at position ② in FIG. 4.

Referring to FIG. 6, FIG. 6 is a schematic diagram showing the connection of cascade signal lines at position ② in FIG. 4. The third signal input line 24 is used for connecting between the last one of the third GOA units of one gate driving sub-circuit in adjacent two gate driving sub-circuits and the first one of the third GOA units of the other gate driving sub-circuit in adjacent two of the gate driving sub-circuits.

Figure 8:
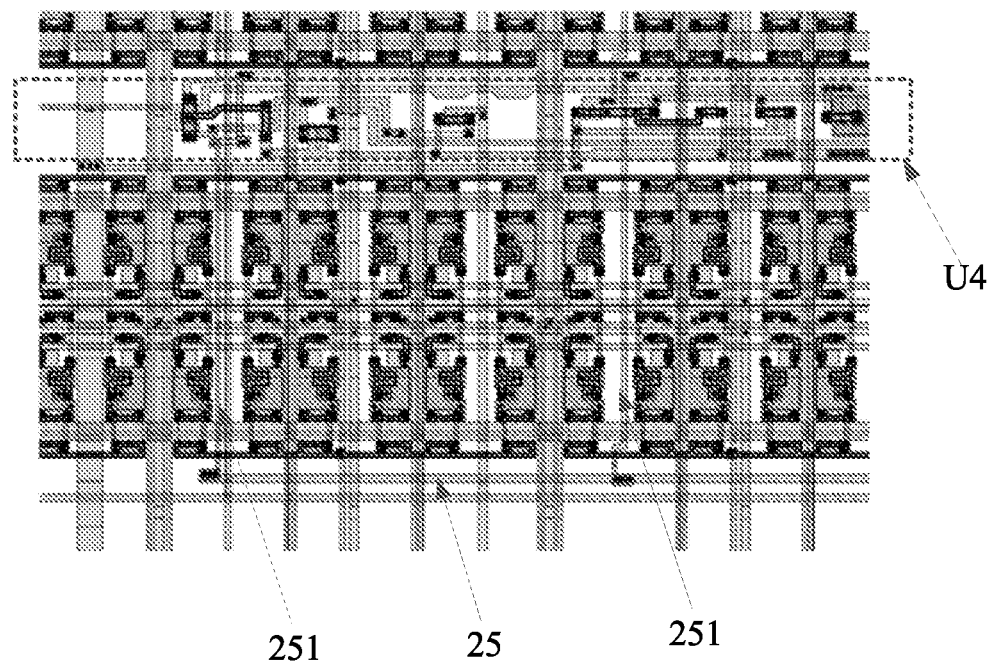
FIG. 8 is a schematic diagram showing the connection of cascade signal lines at position ④ in FIG. 4.

Referring to FIG. 8, FIG. 8 is a schematic diagram showing the connection of cascade signal lines at position ④ in FIG. 4. The fourth signal input line 25 is used for connecting between the last one of the fourth GOA units of one gate driving sub-circuit in adjacent two of the gate driving sub-circuits and the first one of the fourth GOA units of the other gate driving sub-circuit in adjacent two of the gate driving sub-circuits.

Optionally, a first gap is provided between two adjacent columns of sub-pixel driving circuits; a second gap is provided between two adjacent rows of sub-pixel driving circuits. The second signal input line includes two parallel second signal input sub-lines, where at least a portion of one second signal input sub-line extends in the second direction, at least a portion of the other second signal input sub-line extends in the second direction, and the two parallel second signal input sub-lines are located in the same second gap.

The third signal input line includes two parallel third signal input sub-lines, where at least a portion of one third signal input sub-line extends in the second direction, at least a portion of the other third signal input sub-line extends in the second direction, and the two parallel third signal input sub-lines are located in different first gaps. The fourth signal input line includes two parallel fourth signal input sub-lines, where at least a portion of one fourth signal input sub-line extends in the second direction, at least a portion of the other third signal input sub-line extends in the second direction, and the two parallel third signal input sub-lines are located in different first gaps.

The embodiments of the present disclosure can prevent the attenuation of a single signal input sub-line in the process of transmission of cascade signals by setting two parallel signal input sub-lines.

Referring to FIG. 6, the third signal input line 24 coupled to the third GOA unit U3 includes two parallel third signal input sub-lines 241.

Referring to FIG. 7, the second signal input line 23 coupled to the second GOA unit U2 includes two parallel second signal input sub-lines 231.

Referring to FIG. 8, the fourth signal input line 25 coupled to the fourth GOA unit U4 includes two parallel fourth signal input sub-lines 251.

Figure 9:
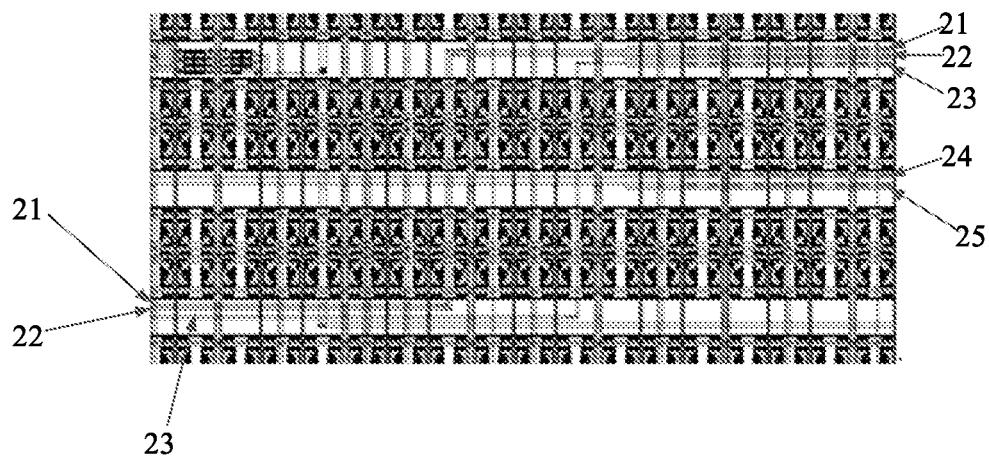
FIG. 9 is a schematic diagram showing the connection of cascade signal lines at position ⑤ in FIG. 4.

FIG. 9 is a schematic diagram showing the connection of cascade signal lines at position ⑤ in FIG. 4.

Figure 16:
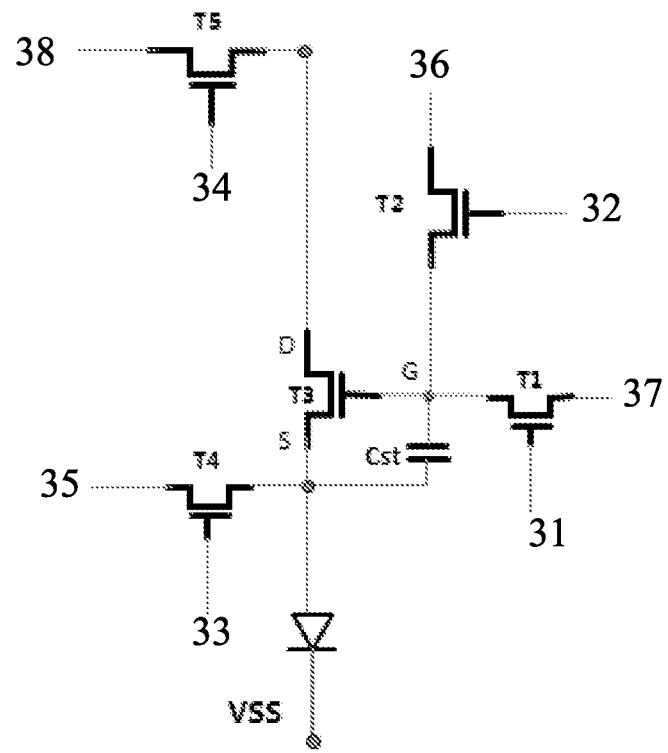
FIG. 16 is a schematic diagram of a pixel driving circuit provided by an embodiment of the present disclosure.

Referring to FIG. 16, the profiled display panel further includes: a plurality of rows of sub-pixel driving circuits located on a base substrate, and the sub-pixel driving circuit at least includes: a data writing transistor T1, a first reset transistor T2, a driving transistor T3, a second reset transistor T4, and a light-emitting control transistor T5.

The sub-pixel driving circuits further include: first lines 31, second scanning lines 32, third scanning lines 33, light-emitting control signal lines 34, first initialization signal lines 35, second initialization signal lines 36, data lines 37, and power lines 38.

A first electrode of the data writing transistor T1 is coupled to a corresponding one of the data line 37, a second electrode of the data writing transistor T1 is coupled to a second electrode of the first reset transistor T2, and a gate electrode of the data writing transistor T1 is coupled to a corresponding one of the first scanning line 31.

A first electrode of the first reset transistor T2 is coupled to a corresponding one of the second initialization signal line 36, a second electrode of the first reset transistor T2 is coupled to the second electrode of the data writing transistor T1, and a gate electrode of the first reset transistor T2 is coupled to a corresponding one of the second scanning line 32.

A first electrode of the driving transistor T3 is coupled to a second electrode of the second reset transistor T4, a second electrode of the driving transistor T3 is coupled to a second electrode of the light-emitting control transistor T5, and a gate electrode of the driving transistor T3 is coupled to the second electrode of the data writing transistor T1.

A first electrode of the second reset transistor T4 is coupled to a corresponding one of the first initialization signal line 35, a second electrode of the second reset transistor T4 is coupled to an anode of the light-emitting element, and a gate electrode of the second reset transistor T4 is coupled to a corresponding one of the third scanning line 33.

A first electrode of the light-emitting control transistor T5 is coupled to a corresponding one of the power line 38, a second electrode of the light-emitting control transistor T5 is coupled to the second electrode of the driving transistor T3, and a gate electrode of the light-emitting control transistor T5 is coupled to the light-emitting control signal line 34.

A first plate of a storage capacitor Cst is reused as the gate electrode of the driving transistor T3, and a second plate of the storage capacitor Cst is coupled to the second electrode of the second reset transistor T4.

The sub-pixel driving circuit of the profiled display panel provided by the embodiments of the present disclosure is a 5T1C pixel driving circuit, and the brightness of the organic light-emitting diode can be ensured to be uniform.

Optionally, the first GOA unit is coupled to the first scanning line; the second GOA unit is coupled to the second scanning line; the third GOA unit is coupled to the third scanning line; and the fourth GOA unit is coupled to the light-emitting control signal line.

In the embodiments of the present disclosure, the first GOA unit is coupled to the first scanning line 31, and the first scanning line 31 is coupled to the gate electrode of the data writing transistor T1, that is, the first GOA unit can provide a gate driving signal for the data writing transistor T1; the second GOA unit is coupled to the second scanning line 32, the second scanning line 32 is coupled to the gate electrode of the first reset transistor T2, that is, the second GOA unit can provide a gate driving signal for the first reset transistor T2; the third GOA unit is coupled to the third scanning line 33, the third scanning line 33 is coupled to the gate electrode of the second reset transistor T4, that is, the third GOA unit can provide a gate driving signal for the second reset transistor T4; the fourth GOA unit is coupled to the light-emitting control signal line 34, and the light-emitting control signal line 34 is coupled to the gate electrode of the light-emitting control transistor T5, that is, the fourth GOA unit can provide a gate driving signal for the light-emitting control transistor T5.

Optionally, orthographic projections of the first GOA unit, the second GOA unit, the third GOA unit and the fourth GOA unit onto the base substrate are located between orthographic projections of two adjacent rows of sub-pixel driving circuits onto the base substrate.

In the profiled display panel provided by the embodiments of the present disclosure, the gate driving circuit is arranged in the display area, so that the transmission distance between the gate driving circuit and the sub-pixel driving circuit is reduced, and the refresh frequency of the display panel is increased.

Referring to FIG. 5, the orthographic projection of the first GOA unit onto the base substrate is located between the orthographic projections of adjacent two rows of sub-pixel driving circuits onto the base substrate, and at the gap between the two rows of sub-pixel driving circuits.

Similarly, a second GOA unit, a third GOA unit, and a fourth GOA unit are also located at the gap between the two rows of sub-pixel driving circuits.

Optionally, the orthographic projection of the first conductive patterns onto the base substrate does not overlap with an orthographic projection of the data line onto the base substrate, an orthographic projection of the power line onto the base substrate, an orthographic projection of the first initialization signal line onto the base substrate, and an orthographic projection of the second initialization signal line onto the base substrate.

Because the first conductive patterns are made of the first source-drain metal layer, and the data lines, the power lines, the first initialization signal lines, and the second initialization signal lines are also made of the first source-drain metal layer, the orthographic projection of the first conductive patterns onto the base substrate keeps off the orthographic projection of the data lines onto the base substrate, the orthographic projection of the power lines onto the base substrate, and the orthographic projection of the first initialization signal line onto the base substrate and the orthographic projection of the second initialization signal line onto the base substrate, which can avoid a crosstalk between the cascade signal lines and the data lines, the power lines, the first initialization signal lines, and the second initialization signal lines.

Optionally, the first GOA unit, the second GOA unit, the third GOA unit, and the fourth GOA unit include: a general reset terminal, a first clock signal terminal, a second clock signal terminal, and a high-level terminal. The profiled display panel further includes: a plurality of buses and a plurality of common signal line groups located on the base substrate. The plurality of buses at least include: a plurality of reset buses, a plurality of first clock buses, a plurality of second clock buses, and a plurality of high-level buses. At least one of the common signal line groups includes:

a plurality of general reset signal lines located on the base substrate, where one end of at least one of the general reset signal lines is coupled to a corresponding one of the reset buses, and the other end of at least one of the general reset signal lines is coupled to the general reset terminal of the first GOA unit, the second GOA unit, the third GOA unit, or the fourth GOA unit;

a plurality of first clock signal lines located on the base substrate, where one end of at least one of the first clock signal lines is coupled to a corresponding one of the first clock buses, and the other end of at least one of the first clock signal lines is coupled to the first clock signal terminal of the first GOA unit, the second GOA unit, the third GOA unit, or the fourth GOA unit; and a plurality of second clock signal lines located on the base substrate, where one end of at least one of the second clock signal lines is coupled to a corresponding one of the second clock buses, and the other end of at least one of the second clock signal lines is coupled to the second clock signal terminal of the first GOA unit, the second GOA unit, the third GOA unit, or the fourth GOA unit; and a plurality of high-level signal lines located on the base substrate, where one end of at least one of the high-level signal lines is coupled to a corresponding high-level bus, and the other end of at least one of the high-level signal lines is coupled to the high-level terminal of the first GOA unit, the second GOA unit, the third GOA unit, or the fourth GOA unit.

In embodiments of the present disclosure, the plurality of common signal line groups are connected to the buses such that the buses are capable of providing common signals through the plurality of common signal line groups to the plurality of gate driving sub-circuits.

Optionally, a length of the cascade signal line between two gate driving sub-circuits is greater than a length of the cascade signal line between two first GOA units included in the gate driving sub-circuit;

the length of the cascade signal line between the two gate driving sub-circuits is greater than a length of the cascade signal line between the two second GOA units included in the gate driving sub-circuit;

the length of the cascade signal line between the two gate driving sub-circuits is greater than a length of the cascade signal line between the two third GOA units included in the gate driving sub-circuit; and the length of the cascade signal line between the two gate driving sub-circuits is greater than a length of the cascade signal line between the two fourth GOA units included in the gate driving sub-circuit.

Since multiple gate driving sub-circuits are located in different display sub-areas, the length of a cascade signal line between two gate driving sub-circuits needs to be longer than the length of a cascade signal line between two first GOA units, two second GOA units, two third GOA units, or two fourth GOA units included in the same gate driving sub-circuit.

However, at the same time, the length of the cascade signal line between the two gate driving sub-circuits increases, which leads to the increase of the resistance of the cascade signal lines between the two gate driving sub-circuits, so the resistance on the cascade signal lines between the two gate driving sub-circuits is not reduced. The first cascade trace is in a design of double-layer and having intervals; the first source-drain metal layer with a smaller sheet resistance is used for the second cascade traces.

Optionally, the first cascade trace further includes: a fourth conductive pattern, electrically connected to the plurality of first conductive patterns, the orthographic projection of the plurality of first conductive patterns onto the base substrate at least partially overlaps an orthographic projection of the fourth conductive pattern onto the base substrate. The fourth conductive pattern is electrically connected to the second conductive pattern, and the orthographic projection of the second conductive pattern onto the base substrate at least partially overlaps the orthographic projection of the fourth conductive pattern onto the base substrate. The embodiments of the present disclosure can realize the three-layer trace design of the first cascade traces by making the first cascade trace further include the fourth conductive pattern arranged on the second gate metal layer.

Further, the fourth conductive pattern is arranged in the second gate metal layer.

Further, the profiled display panel further includes a second source-drain metal layer located a side of the first source-drain metal layer away from the base substrate.

The double-layer traces of the embodiments of the present disclosure may be formed by using two metal layers of the first gate metal layer, the second gate metal layer, the first source-drain metal layer, and the second source-drain metal layer.

The three-layer traces of the embodiments of the present disclosure may be formed by using two metal layers of the first gate metal layer, the second gate metal layer, the first source-drain metal layer, and the second source-drain metal layer.

Optionally, the second cascade traces further include: a third gate metal layer located between the second gate metal layer and the first source-drain metal layer.

The double-layer traces of the embodiments of the present disclosure may be formed by using two metal layers of the first gate metal layer, a second gate metal layer, a third gate metal layer, the first source-drain metal layer, and the second source-drain metal layer.

The three-layer traces of the embodiments of the present disclosure may be formed by using two metal layers of the first gate metal layer, the second gate metal layer, a third gate metal layer, the first source-drain metal layer, and the second source-drain metal layer.

It should be noted that, depending on the number of metal film layers included in the profiled display panel, the first cascade traces can be designed as three or more layers.

Optionally, the second cascade traces further include: a fifth conductive pattern, electrically connected to the third conductive patterns, an orthographic projection of the fifth conductive patterns onto the base substrate at least partially overlaps an orthographic projection of the third conductive pattern onto the base substrate.

Further, the fifth conductive pattern is arranged on the first gate metal layer.

The first cascade trace may be designed as double-layer trace, three-layer trace, or multi-layer trace according to the number of metal film layers, and similarly, the second cascade trace may be designed not only as single-layer trace but also as double-layer trace, three-layer trace, or multi-layer trace.

It should be noted that the double-layer trace and three-layer trace can be formed by not only using two metal layers or three metal layers with different layers, but also using two laminated conductive layers on the same metal layer.

Illustratively, in a case that double-layer traces of the first cascade traces in the embodiments of the present disclosure are formed by using two metal layers in different layers, such as the first gate metal layer and the first source-drain metal layer, the first gate metal layer and the first source-drain metal layer may be directly electrically connected without arranging via holes, so that an insulating layer between the first gate metal layer and the first source-drain metal layer is omitted.

Illustratively, in a case that double-layer traces of the first cascade traces in the embodiments of the present disclosure are formed by using two stacked conductive layers in the same metal layer, for example, two signal lines extending in the first direction may be formed by the first gate metal layer, and the two signal lines are sequentially stacked in the direction away from the base substrate.

Optionally, the plurality of mutually cascaded gate driving sub-circuits include: a first gate driving sub-circuit, a second gate driving sub-circuit, a third gate driving sub-circuit and a fourth gate driving sub-circuit. The first common signal line group is coupled to the first gate driving sub-circuit and the second gate driving sub-circuit. The second common signal line group is coupled to the third gate driving sub-circuit. The third common signal line group is coupled to the fourth gate driving sub-circuit.

The embodiments of the present disclosure reduce the area occupied by the common signal line group on the display panel by coupling the first common signal line group with the first gate driving sub-circuit and the second gate driving sub-circuit, that is, one common signal line group simultaneously provides a common signal for two gate driving sub-circuits.

Figure 13:
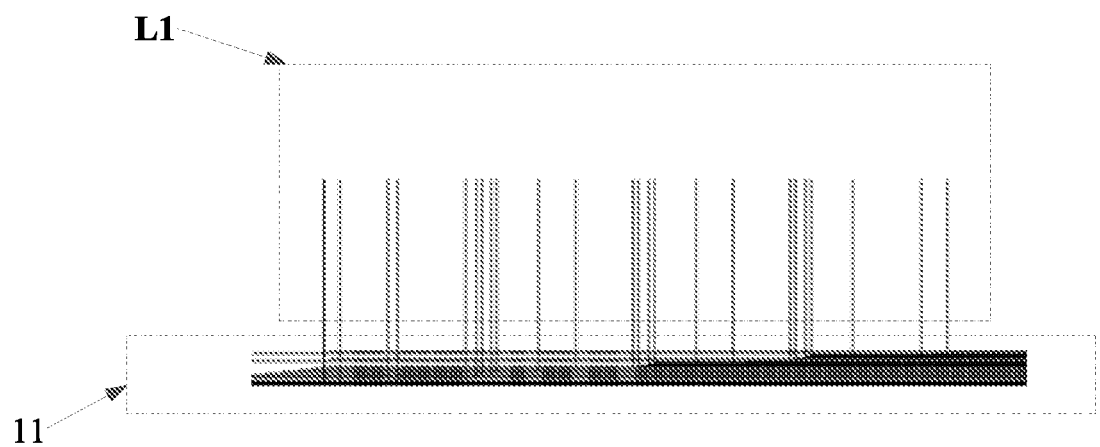
FIG. 13 is a schematic diagram showing the connection between a first common signal line group and the bus.

Referring to FIG. 3, FIG. 4 and FIG. 13, the profiled display panel includes three common signal line groups located on the base substrate, namely a first common signal line group L1, a second common signal line group L2, and a third common signal line group L3.

The first common signal line group L1 simultaneously provides common signals to gate driving sub-circuits in the upper frame and the left frame, referring to FIG. 4, the common signal line coupled to the gate driving sub-circuit of the left frame is connected to the common signal line coupled to the gate driving sub-circuit of the upper frame, and the first common signal line group L1 is connected to the buses. FIG. 13 is a schematic diagram showing the connection between a first common signal line group and the bus. In FIG. 3, area A4 is an area where the first common signal line group is connected to the buses.

The second common signal line group L2 provides common signals for the gate driving sub-circuits in the lower frame. Because the gate driving sub-circuits in the lower frame are close to the buses, the common signal lines coupled to the gate driving sub-circuits in the lower frame are directly coupled to the buses.

The third common signal line group L3 provides common signals to the gate driving sub-circuits in the right frame.

At least one of the first GOA unit, the second GOA unit, the third GOA unit, and the fourth GOA unit includes a general reset terminal TRS, a first clock signal terminal CK, a second clock signal terminal CKB and a high-level terminal VGH. Signal lines connected with the general reset terminal TRS, the first clock signal terminal CK, the second clock signal terminal CKB and the high-level terminal VGH are common signal lines.

At least one of the first GOA unit, the second GOA unit, the third GOA unit, and the fourth GOA unit is connected with multiple common signal lines.

A common signal line coupled to the general reset terminal TRS is a general reset signal line, which has one end coupled to the reset bus among the plurality of buses, and has the other end coupled to the general reset terminal of the first GOA unit, the second GOA unit, the third GOA unit, or the fourth GOA unit.

The common signal line coupled to the first clock signal terminal CK is a first clock signal line, which has one end coupled to the first clock bus among the plurality of buses, and has the other end coupled to the first clock signal terminal of the first GOA unit, the second GOA unit, the third GOA unit, or the fourth GOA unit.

The common signal line coupled to the second clock signal terminal CKB is a second clock signal line, which has one end coupled to second clock buses among the plurality of buses, and has the other end coupled to the second clock signal terminal of the first GOA unit, the second GOA unit, the third GOA unit, or the fourth GOA unit.

The common signal line coupled to the high-level terminal VGH is a high-level signal line, one end of which is coupled to the high-level bus among the plurality of buses, and the other end of which is coupled to the high-level terminal of the first GOA unit, the second GOA unit, the third GOA unit, or the fourth GOA unit.

Optionally, the orthographic projection of the first conductive pattern onto the base substrate does not overlap an orthographic projection of the first clock signal line onto the base substrate and an orthographic projection of the second clock signal line onto the base substrate.

The orthographic projection of the first conductive pattern onto the base substrate is not overlapped with the orthographic projection of the first clock signal line onto the base substrate and the orthographic projection of the second clock signal line onto the base substrate, which can avoid the cross-talk between cascade signal lines and first and second clock signal lines.

Referring to FIG. 12, the first conductive patterns 51 are arranged in the same layer and made of the same material as the first clock signal line 41 and the second clock signal line 42.

Since the gate driving sub-circuits are located in the display area, the first clock signal line 41 and the second clock signal line 42 are also located in the display area. In the related art, because the gate driving circuits are located in the frame area, the clock signal lines are usually located in the frame area.

Optionally, at least one of the buses includes a third conductive layer and a fourth conductive layer, the third conductive layer is fabricated by using the first source-drain metal layer, and the fourth conductive layer is fabricated by using the first gate metal layer.

The embodiments of the present disclosure can reduce the resistance of buses by making at least one bus include a third conductive layer and a fourth conductive layer.

Referring to FIG. 11, at least one of the buses is also modified from the original single-layer GT to spaced SD/GT double-layer traces.

Optionally, the profiled display panel includes a D-shaped display panel.

The profiled display panel provided by the embodiments of the present disclosure includes a D-shaped display panel, which can realize diversified displays according to different application scenarios.

The profiled display panel in the embodiments of the present disclosure may be an alphabet-shaped screen, and the profiled display panel may include a D-shaped display panel, and may also have other shapes including a D-shape, such as a B-shape, a P-shape, or a q-shape. The left and right sides of the D-shape are asymmetric.

The second aspect of the present disclosure also provides a display device, including the above-mentioned profiled display panel.

The display device includes, but not limited to: a radio frequency unit, a network module, an audio output unit, an input unit, a sensor, a display unit, a user input unit, an interface unit, a memory, a processor, and a power supply, etc. It will be appreciated by those skilled in the art that the structure of the above display device does not constitute a limitation on the display device, and the display device can include more or fewer components, or combine some components, or have different component arrangements. In the embodiments of the present disclosure, the display device includes, but is not limited to, a display, a mobile phone, a tablet computer, a television, wearable electronic equipment, navigation display equipment, etc.

The display device can be a television, a monitor, a digital photo frame, a mobile phone, a tablet computer, and other products or components with display functions. The display device further includes a flexible printed circuit board, a printed circuit board, and a back plate.

In the various method embodiments of the present disclosure, the serial number of each step cannot be used to limit the sequence of each step, and it is within the protection scope of the present disclosure for ordinary technicians in the field to change the sequence of each step without paying creative labor.

It should be noted that the various embodiments described herein are described in a progressively manner with reference to the same or similar parts throughout the various embodiments, with each embodiment focusing on differences from other embodiments. Especially, for the embodiment, because it is basically similar to the product embodiment, the description is relatively simple, and the relevant information can be referred to some descriptions of the product embodiment.

Unless otherwise defined, technical terms or scientific terms used in the present disclosure shall have their ordinary meanings as understood by people with ordinary skills in the field to which the present disclosure belongs. The words "first", "second" and the like used in the present disclosure do not indicate any order, quantity, or importance, but are only used to distinguish different components. Similar words such as "including" or "containing" mean that the elements or objects appearing before the word cover the elements or objects listed after the word and their equivalents, without excluding other elements or objects. Similar words such as "connected" or "linked" are not limited to a physical or mechanical connection, but can include electrical connection, whether direct or indirect. The terms "upper", "lower", "left", "right" and the like are used only to indicate relative positional relationships. When the absolute position of the described object changes, the relative positional relationship can also change correspondingly.

It will be understood that when an element such as a layer, film, area or substrate is referred to as being "on" or "under" another element, it can be "directly on" or "directly under" the other element or intervening elements can be present.

In the description of the above embodiments, specific features, structures, materials or characteristics can be combined in any one or more embodiments or examples suitably.

The above embodiments are only specific implementations of this disclosure, but the protection scope of the present disclosure is not limited thereto. Any person skilled in the technical field can easily think of changes or substitutions within the technical scope of this disclosure, which should be covered by the protection scope of the disclosure. Therefore, the protection scope of the present disclosure should be subjected to the protection scope of the claims.

What is claimed is:

1. A profiled display panel, comprising a display area, wherein the display area comprises a plurality of display sub-areas;

the profiled display panel comprises a base substrate and a gate driving circuit located on the base substrate;

wherein the gate driving circuit comprises:

a plurality of mutually cascaded gate driving sub-circuits, wherein the plurality of mutually cascaded gate driving sub-circuits correspond, in one-to-one manner, to the plurality of display sub-areas, and each of the gate driving sub-circuits is located in a corresponding one of the display sub-areas; and a plurality of cascade signal lines used to couple adjacent two of the gate driving sub-circuits, wherein at least one of the cascade signal lines comprises a first cascade trace extending in a first direction and a second cascade trace extending in a second direction, wherein the first cascade trace comprises a plurality of first conductive patterns arranged on a first conductive layer, and a second conductive pattern arranged on a second conductive layer, the plurality of first conductive patterns are electrically connected to the second conductive pattern, and an orthographic projection of the plurality of first conductive patterns onto the base substrate at least partially overlaps an orthographic projection of the second conductive pattern onto the base substrate; the second cascade trace comprises a third conductive pattern arranged on the first conductive layer.

2. The profiled display panel according to claim 1, wherein the plurality of first conductive patterns are electrically connected to the second conductive pattern through a plurality of via holes.

3. The profiled display panel according to claim 1, wherein the plurality of first conductive patterns are arranged at intervals.

4. The profiled display panel according to claim 3, wherein the profiled display panel comprises a first gate metal layer, a second gate metal layer, and a first source-drain metal layer that are sequentially stacked in a direction away from the base substrate, the first conductive layer is formed by using the first source-drain metal layer, and the second conductive layer is formed by using the first gate metal layer.

5. The profiled display panel according to claim 1, wherein the first cascade trace further comprises:

a fourth conductive pattern, electrically connected to the plurality of first conductive patterns, where the orthographic projection of the plurality of first conductive patterns onto the base substrate at least partially overlaps an orthographic projection of the fourth conductive pattern onto the base substrate;

the fourth conductive pattern is electrically connected to the second conductive pattern, and the orthographic projection of the second conductive pattern onto the base substrate at least partially overlaps the orthographic projection of the fourth conductive pattern onto the base substrate.

6. The profiled display panel according to claim 1, wherein the second cascade trace further comprises:

a fifth conductive pattern, electrically connected to the third conductive pattern, an orthographic projection of the fifth conductive pattern onto the base substrate at least partially overlaps an orthographic projection of the third conductive pattern onto the base substrate.

7. The profiled display panel according to claim 1, wherein the profiled display panel further comprises: a plurality of rows of sub-pixel driving circuits located on the base substrate, and the sub-pixel driving circuits further comprise:

a plurality of first initialization signal lines, wherein at least a portion of the first initialization signal line extends in the second direction;

a plurality of second initialization signal lines, wherein at least a portion of the second initialization signal line extends in the second direction;

a plurality of data lines, wherein at least a portion of the data line extending in the second direction; and a plurality of power lines, wherein at least a portion of the power line extending in the second direction, wherein orthographic projection of the first conductive patterns onto the base substrate does not overlap an orthographic projection of the data lines onto the base substrate, an orthographic projection of the power lines onto the base substrate, an orthographic projection of the first initialization signal lines onto the base substrate, and an orthographic projection of the second initialization signal lines onto the base substrate.

8. The profiled display panel according to claim 7, wherein the first initialization signal lines, the second initialization signal lines, the data lines and the power lines are arranged in a same layer and made of a same material as the first conductive patterns.

9. The profiled display panel according to claim 8, wherein the sub-pixel driving circuit further comprises: a data writing transistor, a first reset transistor, a driving transistor, a second reset transistor, and a light-emitting control transistor;

the sub-pixel driving circuits further comprise: first scanning lines, second scanning lines, third scanning lines, and light-emitting control signal lines;

wherein a first electrode of the data writing transistor is coupled to a corresponding one of the data lines, a second electrode of the data writing transistor is coupled to a second electrode of the first reset transistor, and a gate electrode of the data writing transistor is coupled to a corresponding one of the first scanning lines;

a first electrode of the first reset transistor is coupled to a corresponding one of the second initialization signal lines, and a second electrode of the first reset transistor is coupled to the second electrode of the data writing transistor, and a gate electrode of the first reset transistor is coupled to a corresponding one of the second scanning lines;

a first electrode of the driving transistor is coupled to a second electrode of the second reset transistor, a second electrode of the driving transistor is coupled to a second electrode of the light-emitting control transistor, and a gate electrode of the driving transistor is coupled to the second electrode of the data writing transistor;

a first electrode of the second reset transistor is coupled to a corresponding one of the first initialization signal lines, a second electrode of the second reset transistor is coupled to an anode of the light-emitting element, and a gate electrode of the second reset transistor is coupled to a corresponding one of the third scanning lines;

a first electrode of the light-emitting control transistor is coupled to a corresponding one of the power lines, a second electrode of the light-emitting control transistor is coupled to the second electrode of the driving transistor, and a gate electrode of the light-emitting control transistor is coupled to the light-emitting control signal line;

a first plate of a storage capacitor is reused as the gate electrode of the driving transistor, and a second plate of the storage capacitor is coupled to the second electrode of the second reset transistor.

10. The profiled display panel according to claim 9, wherein at least one of the gate driving sub-circuits comprises: a plurality of mutually cascaded first GOA units, a plurality of mutually cascaded second GOA units, a plurality of mutually cascaded third GOA units, and a plurality of mutually cascaded fourth GOA units;

wherein the first GOA unit at least comprises: a first cascade output terminal, a reset signal terminal, and a first signal input terminal;

the second GOA unit comprises a second signal input terminal and a second cascade output terminal;

the third GOA unit comprises a third signal input terminal and a third cascade output terminal; and the fourth GOA unit comprises a fourth signal input terminal and a fourth cascade output terminal;

the plurality of cascade signal lines comprise: a first cascade output signal line, a reset signal line, a second signal input line, a third signal input line, and a fourth signal input line;

wherein one end of the first cascade output signal line is coupled to a first cascade output terminal of a last one of the first GOA units of one gate driving sub-circuit in adjacent two of the gate driving sub-circuits, and the other end of the first cascade output signal line is coupled to a first signal input terminal of a first one of the first GOA units of the other gate driving sub-circuit in adjacent two of the gate driving sub-circuits;

one end of the reset signal line is coupled to a reset signal terminal of the last one of the first GOA units of one gate driving sub-circuit in adjacent two of the driving sub-circuits, and the other end of the reset signal line is coupled to the first signal input terminal of the first one of the first GOA units of the other gate driving sub-circuit in adjacent two of the gate driving sub-circuits;

one end of the second signal input line is coupled to a second cascade output terminal of a last one of the second GOA units of one gate driving sub-circuit in adjacent two of the gate driving sub-circuits, and the other end of the second signal input line is coupled to a second signal input terminal of a first one of the second GOA units of the other gate driving sub-circuit in adjacent two of the gate driving sub-circuits;

one end of the third signal input line is coupled to a third cascade output terminal of a last one of the third GOA units of one gate driving sub-circuit in adjacent two of the gate driving sub-circuits, and the other end of the third signal input line is coupled to a third signal input terminal of a first one of the third GOA units of the other gate driving sub-circuit in adjacent two of the gate driving sub-circuits;

one end of the fourth signal input line is coupled to a fourth cascade output terminal of a last one of the fourth GOA units of one gate driving sub-circuit in adjacent two of the gate driving sub-circuits, and the other end of the fourth signal input line is coupled to a fourth signal input terminal of a first one of the fourth GOA units of the other gate driving sub-circuit in adjacent two of the gate driving sub-circuits.

11. The profiled display panel according to claim 10, wherein a first gap is provided between two adjacent columns of sub-pixel driving circuits;

a second gap is provided between two adjacent rows of sub-pixel driving circuits;

the second signal input line comprises two parallel second signal input sub-lines, wherein at least a portion of one second signal input sub-line extends in the second direction, at least a portion of the other second signal input sub-line extends in the second direction, and the two parallel second signal input sub-lines are located in a same second gap;

the third signal input line comprises two parallel third signal input sub-lines, wherein at least a portion of one third signal input sub-line extends in the second direction, at least a portion of the other third signal input sub-line extends in the second direction, and the two parallel third signal input sub-lines are located in different first gaps; and the fourth signal input line comprises two parallel fourth signal input sub-lines, wherein at least a portion of one fourth signal input sub-line extends in the second direction, at least a portion of the other third signal input sub-line extends in the second direction, and the two parallel third signal input sub-lines are located in different first gaps.

12. The profiled display panel according to claim 10, wherein the first GOA unit is coupled to the first scanning lines;

the second GOA unit is coupled to the second scanning lines;

the third GOA unit is coupled to the third scanning lines; and the fourth GOA unit is coupled to the light-emitting control signal lines.

13. The profiled display panel according to claim 10, wherein orthographic projections of the first GOA unit, the second GOA unit, the third GOA unit, and the fourth GOA unit onto the base substrate are located between orthographic projections of two adjacent rows of sub-pixel driving circuits onto the base substrate.

14. The profiled display panel according to claim 10, wherein the first GOA unit, the second GOA unit, the third GOA unit, and the fourth GOA unit comprise: a general reset terminal, a first clock signal terminal, a second clock signal terminal, and a high-level terminal;

the profiled display panel further comprises: a plurality of buses and a plurality of common signal line groups located on the base substrate;

the plurality of buses at least comprise: a plurality of reset buses, a plurality of first clock buses, a plurality of second clock buses, and a plurality of high-level buses;

at least one of the common signal line groups comprises:

a plurality of general reset signal lines located on the base substrate, wherein one end of at least one of the general reset signal lines is coupled to a corresponding one of the reset buses, and the other end is coupled to the general reset terminal of the first GOA unit, the second GOA unit, the third GOA unit, or the fourth GOA unit;

a plurality of first clock signal lines located on the base substrate, wherein one end of at least one of the first clock signal lines is coupled to a corresponding one of the first clock buses, and the other end is coupled to the first clock signal terminal of the first GOA unit, the second GOA unit, the third GOA unit, or the fourth GOA unit;

a plurality of second clock signal lines located on the base substrate, one end of at least one of the second clock signal lines is coupled to a corresponding one of the second clock buses, and the other end is coupled to the second clock signal terminal of the first GOA unit, the second GOA unit, the third GOA unit, or the fourth GOA unit; and a plurality of high-level signal lines located on the base substrate, one end of at least one of the high-level signal lines is coupled to a corresponding one of the high-level buses, and the other end is coupled to the high-level terminal of the first GOA unit, the second GOA unit, the third GOA unit, or the fourth GOA unit.

15. The profiled display panel according to claim 14, wherein a length of a cascade signal line between two of the gate driving sub-circuits is greater than a length of a cascade signal line between two of the first GOA units comprised in the gate driving sub-circuits;

the length of the cascade signal line between two of the gate driving sub-circuits is greater than a length of a cascade signal line between two of the second GOA units comprised in the gate driving sub-circuits;

the length of the cascade signal lines between the two gate driving sub-circuits is greater than a length of a cascade signal line between two of the third GOA units comprised in the gate driving sub-circuits; and the length of the cascade signal lines between the two gate driving sub-circuits is greater than a length of a cascade signal line between two of the fourth GOA units comprised in the gate driving sub-circuits.

16. The profiled display panel according to claim 14, wherein the orthographic projection of the first conductive patterns onto the base substrate does not overlap an orthographic projection of the first clock signal line onto the base substrate and an orthographic projection of the second clock signal line onto the base substrate.

17. The profiled display panel according to claim 14, wherein the first clock signal line and the second clock signal line are fabricated by using the first source-drain metal layer.

18. The profiled display panel according to claim 14, wherein at least one of the buses comprises a third conductive layer and a fourth conductive layer, the third conductive layer is fabricated by using the first source-drain metal layer, and the fourth conductive layer is fabricated by using the first gate metal layer.

19. The profiled display panel according to claim 14, wherein the plurality of mutually cascaded gate driving sub-circuits comprise: a first gate driving sub-circuit, a second gate driving sub-circuit, a third gate driving sub-circuit, and a fourth gate driving sub-circuit;

wherein the first common signal line group is coupled to the first gate driving sub-circuit and the second gate driving sub-circuit;

the second common signal line group is coupled to the third gate driving sub-circuit; and the third common signal line group is coupled to the fourth gate driving sub-circuit.

20. A display device, comprising the profiled display panel according to claim 1.

* * * * *